(12) United States Patent
Takemori et al.

(10) Patent No.: US 7,525,124 B2
(45) Date of Patent: Apr. 28, 2009

(54) SUBMOUNT FOR LIGHT EMITTING DIODE AND ITS MANUFACTURING METHOD

(75) Inventors: Hideaki Takemori, Hitachinaka (JP); Satoshi Higashiyama, Hitachinaka (JP); Kenji Mori, Haruhi (JP); Ryoichi Tohmon, Haruhi (JP); Minoru Hirose, Haruhi (JP); Hiroaki Kawaguchi, Haruhi (JP)

(73) Assignees: Hitachi Kyowa Engineering Co., Ltd., Hitachi-shi (JP); Toyoda Gosei Co., Ltd., Nishikasugai-gun (JP)

( * ) Notice: Subject to any disclaimer, the term of this patent is extended or adjusted under 35 U.S.C. 154(b) by 51 days.

(21) Appl. No.: 11/221,817

(22) Filed: Sep. 9, 2005

(65) Prior Publication Data

US 2006/0054910 A1    Mar. 16, 2006

(30) Foreign Application Priority Data

Sep. 14, 2004   (JP) ............................. 2004-266607

(51) Int. Cl.
    *H01L 27/15*   (2006.01)
(52) U.S. Cl. ............................. 257/81; 257/79; 257/678
(58) Field of Classification Search ................. 257/79, 257/979, 81, 678, 98
    See application file for complete search history.

(56) References Cited

U.S. PATENT DOCUMENTS 6,160,834 A * 12/2000 Scott ........................... 372/96

| 6,610,563 | B1 * | 8/2003 | Waitl et al. ................ 438/166 |
| 6,734,935 | B2 * | 5/2004 | Kim et al. ................... 349/114 |
| 2002/0135033 | A1 | 9/2002 | Hara et al. |
| 2003/0057421 | A1 | 3/2003 | Chen |
| 2005/0132747 | A1 | 6/2005 | Takemori et al. |

FOREIGN PATENT DOCUMENTS

| CN | 85 1 00503 A | 9/1986 |
| JP | 11-119014 | 4/1999 |
| JP | 11-265957 | 9/1999 |
| JP | 2000-138305 | 5/2000 |
| JP | 2002-267956 | 9/2002 |
| JP | 2004-219839 | 8/2004 |
| JP | 2005-183558 | 7/2005 |
| JP | 2006-049802 | 2/2006 |
| WO | WO 2004/068182 | 8/2004 |

* cited by examiner

*Primary Examiner*—Roy K Potter
(74) *Attorney, Agent, or Firm*—Mattingly, Stanger, Malur & Brundidge, P.C.

(57) ABSTRACT

A submount for a light emitting diode and its manufacturing method, the submount including a reflector and having a compact size. The submount for the light emitting diode comprises a Si base substrate having input/output terminals formed on a front side thereof, and a Si reflector having a sloped through hole and a reflecting film formed at least on a slope defining the through hole. The Si reflector is mounted on the Si base substrate and is fixedly joined to the Si base substrate. The Si reflector and the Si base substrate are joined to each other by a thin film solder.

3 Claims, 7 Drawing Sheets

SUBMOUNT FOR LIGHT EMITTING DIODE AND ITS MANUFACTURING METHOD

BACKGROUND OF THE INVENTION

1. Field of the Invention

The present invention relates to a submount for a light emitting diode and its manufacturing method.

2. Description of the Related Art

As a package for mounting an optical part, JP-A-11-265957 (Patent Document 1) discloses one example in which a frame is prepared by forming a cavity in one green-sheet with punching, and a bottom plate is prepared, for example, by forming through holes in another green-sheet and metalizing certain regions thereof. Then, the frame and the bottom are laminated together and are subjected to heat pressing and sintering under a reduction atmosphere, following by dicing the laminate into a predetermined size. Also, JP-A-2000-138305 (Patent Document 2) discloses another example in which a frame made of epoxy resins is formed by injection molding or transfer molding, and the frame is joined to a ceramic base substrate by an epoxy-resin adhesive. A high-brightness LED lamp requires a reflector. Hitherto, it has been usual that the reflector is made of another material (a metal or a plastic or the like onto which a metal thin film is affixed), and a submount with a light emitting diode (LED) mounted thereon is disposed in the reflector.

SUMMARY OF THE INVENTION

With the related art that the reflector is made of another material (a metal or a plastic or the like onto which a metal thin film is affixed) and a submount with an LED mounted thereon is disposed in the reflector, however, a problem arises in that the reflector size is enlarged because the reflector is away from the LED. The larger size of the reflector increases the area occupied by a phosphor when the phosphor is filled in the reflector. Since light is emitted from the entirety of the phosphor, an illuminator having a large area is practically resulted and a compact lens design is difficult to realize.

An object of the present invention is to provide a submount for a light emitting diode, which includes a reflector and has a compact size, and a method of manufacturing the submount for the light emitting diode.

(1) To achieve the above object, the present invention provides a submount for a light emitting diode wherein the submount comprises a Si base substrate having input/output terminals formed on a front side thereof; and a Si reflector having a sloped through hole and a reflecting film formed at least on a slope defining the through hole, the Si reflector being mounted on the Si base substrate and fixedly joined to the Si base substrate.

With those features, the submount for the light emitting diode can be obtained which includes the reflector and has a compact size.

(2) In above (1), preferably, the Si base substrate has input/output pads formed on a backside thereof, and the input/output terminals and the input/output pads are electrically connected to each other with metalization made on the through hole formed in the Si base substrate.

(3) In above (1), preferably, the Si reflector and the Si base substrate are joined to each other by a thin film solder.

(4) In above (1), preferably, the reflecting film is an Al thin film.

(5) To achieve the above object, the present invention also provides a method of manufacturing a submount for mounting a light emitting diode thereon, the method comprising the steps of forming input/output terminals on a front side of a Si substrate, thereby manufacturing a Si base substrate; forming a sloped through hole in another Si substrate and forming a reflecting film at least on a slope defining the through hole, thereby manufacturing a Si reflector; and mounting the Si reflector on the Si base substrate and fixedly joining the Si reflector to the Si base substrate.

With that method, the submount for the light emitting diode can be obtained which includes the reflector and has a compact size.

Thus, according to the present invention, it is possible to provide the submount for the light emitting diode, which includes the reflector and has a compact size, and the method of manufacturing the submount for the light emitting diode.

DESCRIPTION OF THE PREFERRED EMBODIMENTS

A submount for a light emitting diode (LED) and its manufacturing method according to a first embodiment of the present invention will be described below with reference to FIGS. 1-7.

Figure 1:
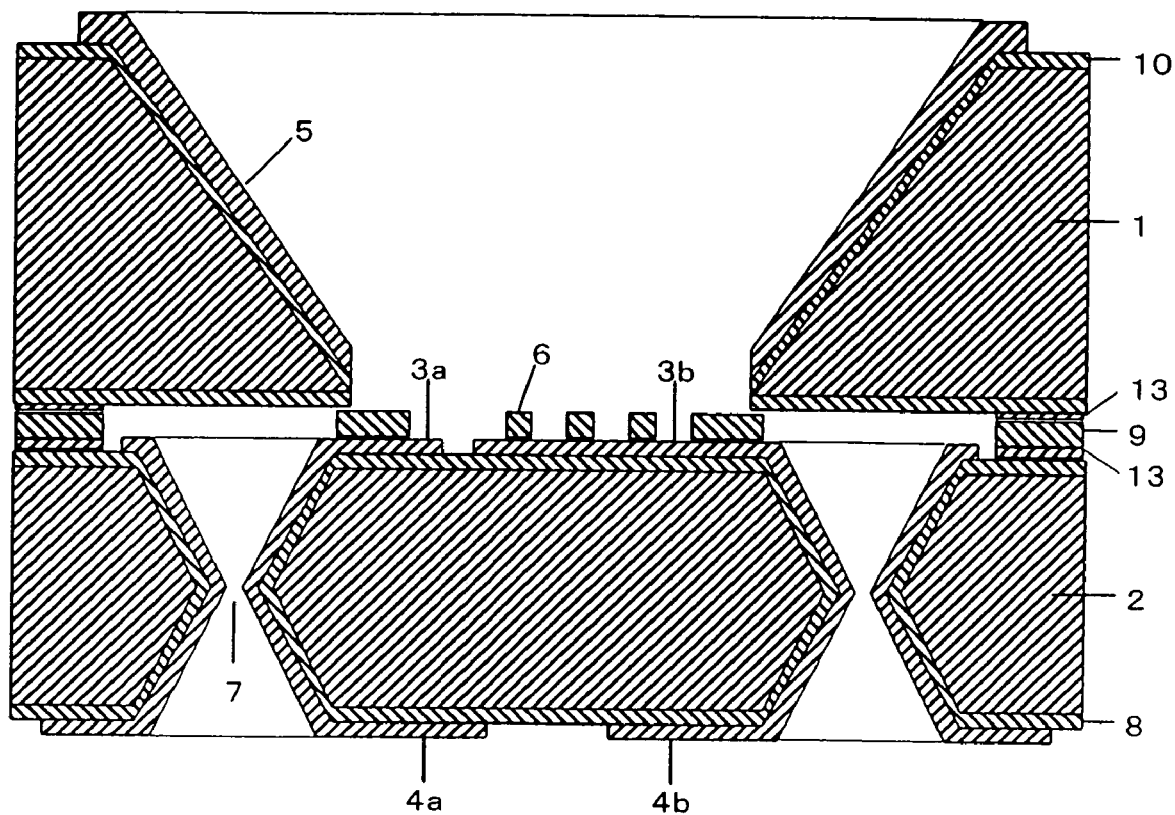
FIG. 1 is a sectional view showing the entire structure of a submount for a light emitting diode (LED) according to one embodiment of the present invention.
Figure 2:
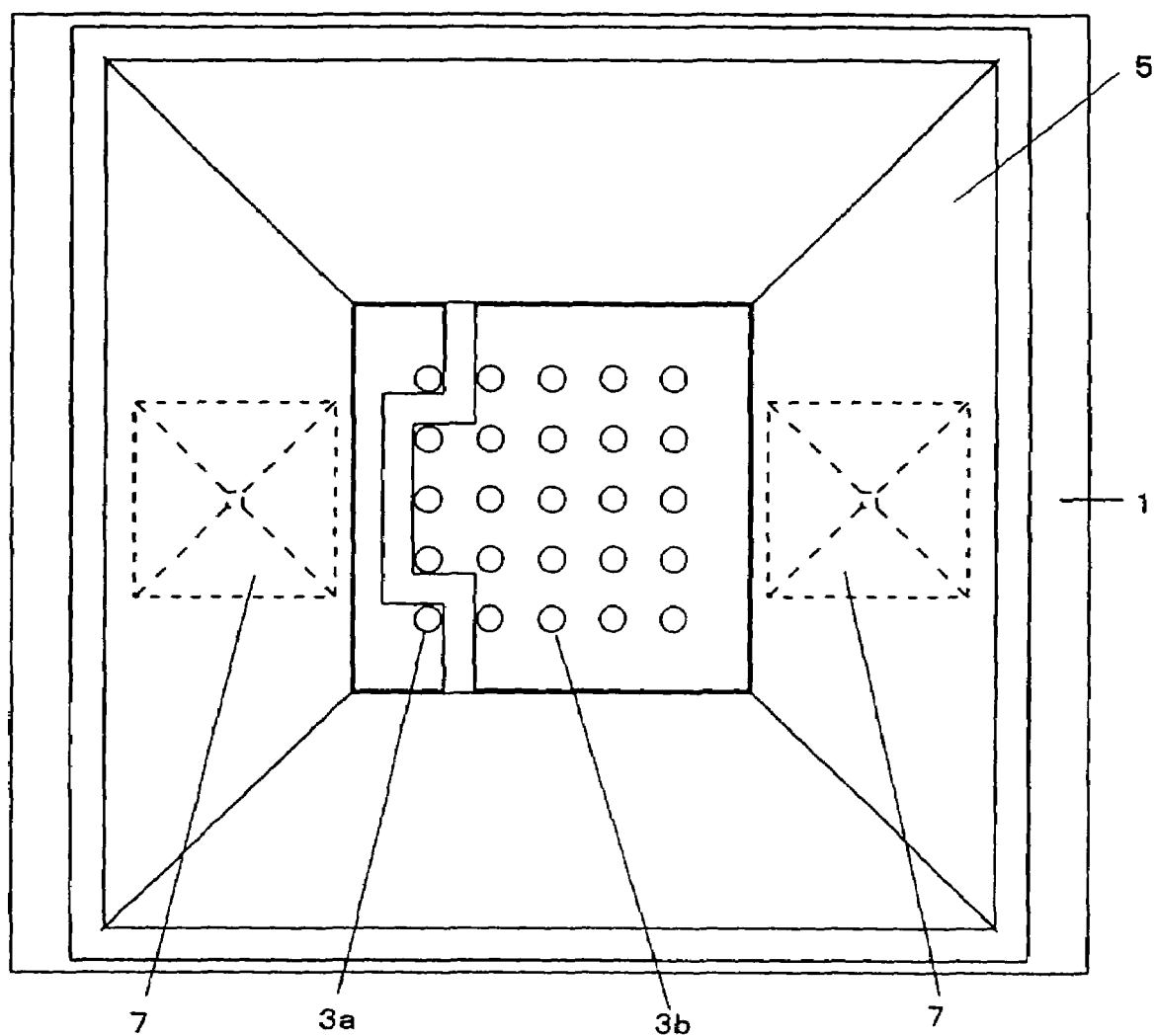
FIG. 2 is a plan view showing the entire structure of the submount for the LED according to one embodiment of the present invention.

First, a description is made of the entire structure of the submount for the LED according to this embodiment with reference to FIGS. 1 and 2.

FIG. 1 is a sectional view showing the entire structure of the submount for the LED according to one embodiment of the present invention, and FIG. 2 is a plan view showing the entire structure of the submount for the LED according to one embodiment of the present invention. Note that, in FIGS. 1 and 2, the same symbols denote the same components.

As shown in FIG. 1, the submount for the LED according to this embodiment is of a structure that a silicon (Si) reflector 1 is joined onto a silicon (Si) base substrate 2 by a thin film solder 9. The Si base substrate 2 is formed by wet etching that is performed from both the front side and the backside of a silicon (Si) substrate. Also, the Si reflector 1 is formed by wet etching that is performed from the front side of a silicon (Si) substrate. Then, the Si reflector 1 is mounted on the Si base substrate 2 of the submount for the LED.

An input/output terminal 3*a* and an input/output terminal 3*b* are formed on an upper surface of the Si base substrate 2, and an input/output pad 4*a* and an input/output pad 4*b* are formed on a lower surface of the Si base substrate 2. Those input/output terminals are electrically connected to those input/output pads, respectively, via trough holes 7 bored in the Si base substrate 2 by wet etching. More specifically, the input/output terminal 3*a* and the input/output pad 4*a* are electrically connected to each other via one trough hole 7 bored by wet etching, and the input/output terminal 3*b* and the input/output pad 4*b* are electrically connected to each other via another trough hole 7 bored by wet etching. As shown in FIG. 2, in this embodiment, the input/output terminal 3*a* is formed in number two and the input/output pad 3*b* is formed in number 23. Furthermore, as shown in FIG. 1, an Al thin film 6 for reflecting light emitted from the LED is formed on the upper surface of the Si base substrate 2.

Because of using the Si substrate having a smooth surface state, the input/output terminals 3*a*, the input/output terminals 3*b*, the input/output pads 4*a*, and the input/output pads 4*b* can be formed on the Si base substrate 2 by patterning with high accuracy. In other words, the patterning accuracy of the terminals is increased by using a base substrate made of Si.

The Si reflector 1 is formed by wet-etching a Si substrate having a crystal plane (100) from the front side thereof such that the crystal plane of each of slopes defining an etched through hole is given by a plane (111), namely, that an angle of the slope relative to a horizontal flat plane is 54.74° in terms of crystallography. An Al thin film 5 is formed on the slopes by vapor deposition using a mask, for example, with an oxide 10 interposed between the Al thin film 5 and the crystal plane for the purpose of increasing a light reflection characteristic.

To mount the Si reflector 1 on the Si base substrate 2 of the submount for the LED, the upper surface of the Si base substrate 2 and a lower surface of the Si reflector 1 are partially metalized as indicated by 13. These metalized regions 13 are joined to each other by a thin-film solder 9. Because the Si reflector 1 and the Si base substrate 2 are joined to each other after forming the Al thin film 5 on the slopes of the Si reflector 1, the Al thin film 5 on the slopes are avoided from contacting the Si base substrate 2.

With the above-described structure that the Si reflector 1 having the slopes is mounted on the Si base substrate 2 of the submount for the LED, the size of the Si reflector 1 can be reduced and the size of the submount for the LED can be made compacter. Accordingly, when a phosphor is filled in the reflector 1, the area occupied by the filled phosphor can be reduced and so can be the area of a finally completed illuminator. As a result, a compact lens design can be realized.

Looking at practical examples for comparison, the known structure (in which the submount including the LED is mounted in the reflector) requires dimensions of 14.2 mm length×10.0 mm width×5.8 mm height, while this embodiment (in which the Si reflector 1 is mounted on the Si base substrate 2), shown in FIG. 1, requires dimensions of 3.4 mm length×3.4 mm width×1.2 mm height. Namely, this embodiment can make the volume compacter to about 2/100 of the known structure. Further, looking at the size of the illuminator, the known structure requires dimensions of 8 mm length×8 mm width at an upper opening of the reflector, this embodiment requires dimensions of 2.5 mm length×2.5 mm width. Namely, this embodiment can reduce the area of the illuminator to about 1/10 of the known structure.

Also, with the above-described structure that the Si reflector 1 having the slopes is mounted on the Si base substrate 2 of the submount for the LED, it is possible to realize a simpler structure and to simplify the process for manufacturing the Si reflector 1 having the slopes.

Further, since the reflector and the submount are made of the same material and joined to each other, both the members show the same degree of expansion even when they are expanded due to generated heat. Therefore, the joined portion is avoided from being subjected to excessive loads, and reliability of the joined portion is increased.

Because of the reflector and the submount being both made of Si, good heat radiation is ensured and the heat generated from the LED can be efficiently dissipated.

Moreover, using the reflector 1 and the submount made of the same material, i.e., Si, enables those members to share their functions and to have more simplified and compact structures. There is no need of installing a separate submount inside the reflector, and the function of the submount can be provided by the Si base substrate. In addition, the structure of this embodiment permits wiring for electrical connection, etc. to be simplified.

The method of manufacturing the submount for the LED according to this embodiment will be described below with reference to FIGS. 3-5.

FIGS. 3A-3F are sectional views showing successive steps of manufacturing the Si submount of the submount for the LED according to one embodiment of the present invention. FIGS. 4A-4E are sectional views showing successive steps of manufacturing the Si reflector mounted on the submount for the LED according to one embodiment of the present invention. FIG. 5 is a sectional view showing the step of mounting the Si reflector on the Si submount according to one embodiment of the present invention. Note that the same symbols as those in FIGS. 1 and 2 denote the same components.

A description is first made of steps of manufacturing the Si submount 2 with reference to FIGS. 3A-3F.

Figure 3A:
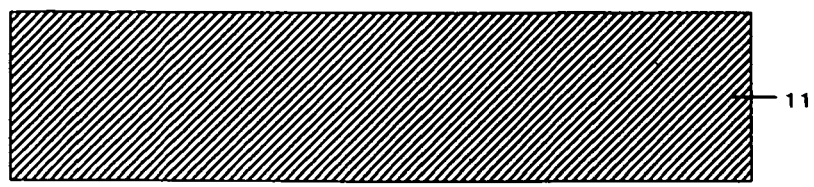
FIGS. 3A-3F are sectional views showing successive steps of manufacturing a Si submount of the submount for the LED according to one embodiment of the present invention.

First, as shown in FIG. 3A, a Si substrate 11 is prepared.

Figure 3B:
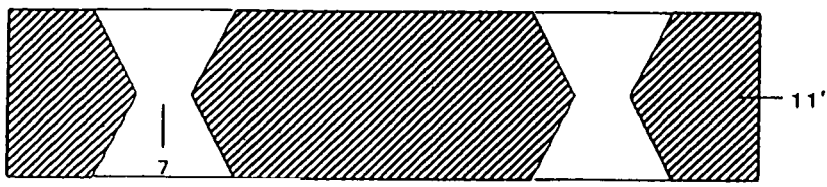

Then, the front side and the backside (upper and lower surfaces as viewed on the drawing) of the Si substrate 11 are subjected to photolithography, and the Si substrate 11 is immersed in an alkaline solution, e.g., a solution of potassium hydroxide, to form the through holes 7 by etching, as shown in FIG. 3B. A Si substrate 11' provided with the through holes is thereby formed.

Figure 3C:
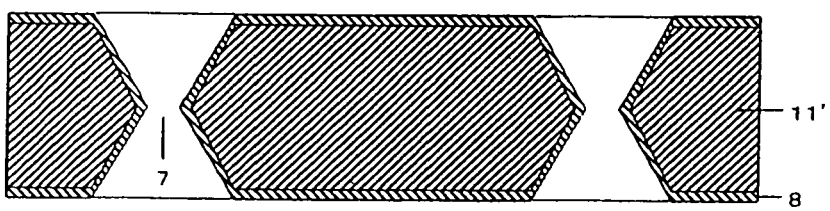

Then, as shown in FIG. 3C, oxides 8 are formed on not only the upper and lower surfaces of the Si substrate 11' provided with the through holes, but also on inner surfaces of the through holes 7.

Figure 3D:
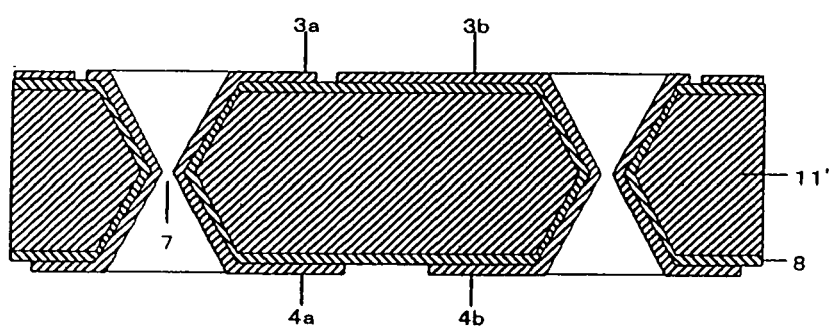

Then, as shown in FIG. 3D, the input/output terminals 3*a*, 3*b* are formed on the upper surface of the Si substrate 11' provided with the through holes, and the input/output pads 4*a*, 4*b* are formed on the lower surface thereof. At the same time, the metalized region 13 shown in FIG. 1 is formed on the upper surface of the Si substrate 11' provided with the through holes.

Figure 3E:
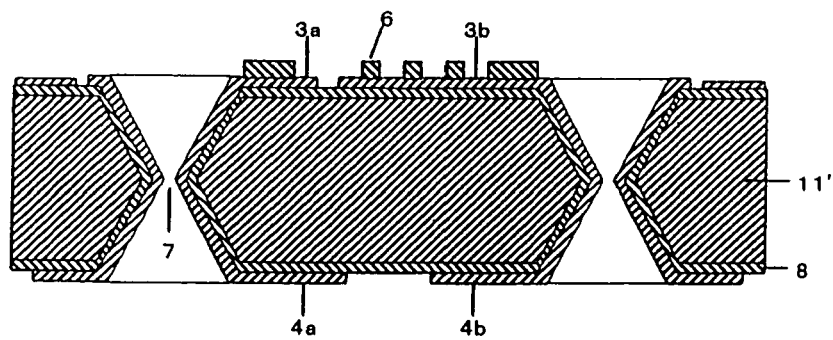

Then, as shown in FIG. 3E, the Al thin film 6 for reflecting light emitted from the LED is formed on the upper surface of the Si substrate 11' provided with the through holes.

Figure 3F:
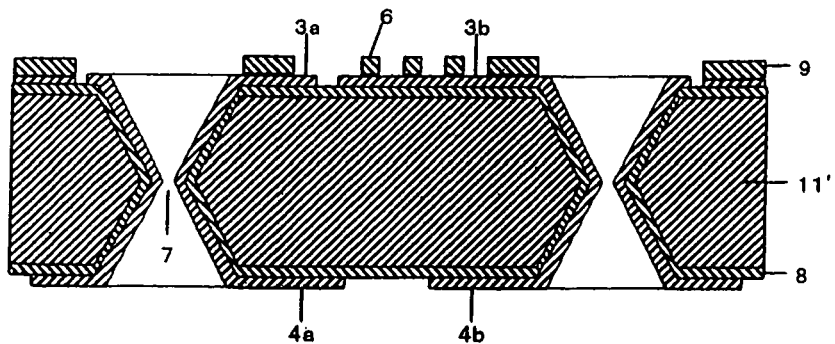

Finally, as shown in FIG. 3F, the metalized region 13 shown in FIG. 1 is formed on the upper surface of the Si substrate 11' provided with the through holes, and the thin-film solder 9 used for joining with the Si reflector 1 is formed on the metalized region 13.

A description is next made of steps of manufacturing the Si reflector 1 with reference to FIG. 4A-4E.

Figure 4A:
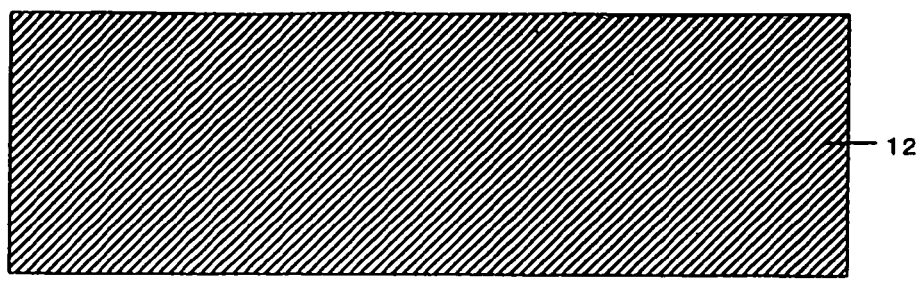
FIGS. 4A-4E are sectional views showing successive steps of manufacturing a Si reflector mounted on the submount for the LED according to one embodiment of the present invention.
Figure 5:
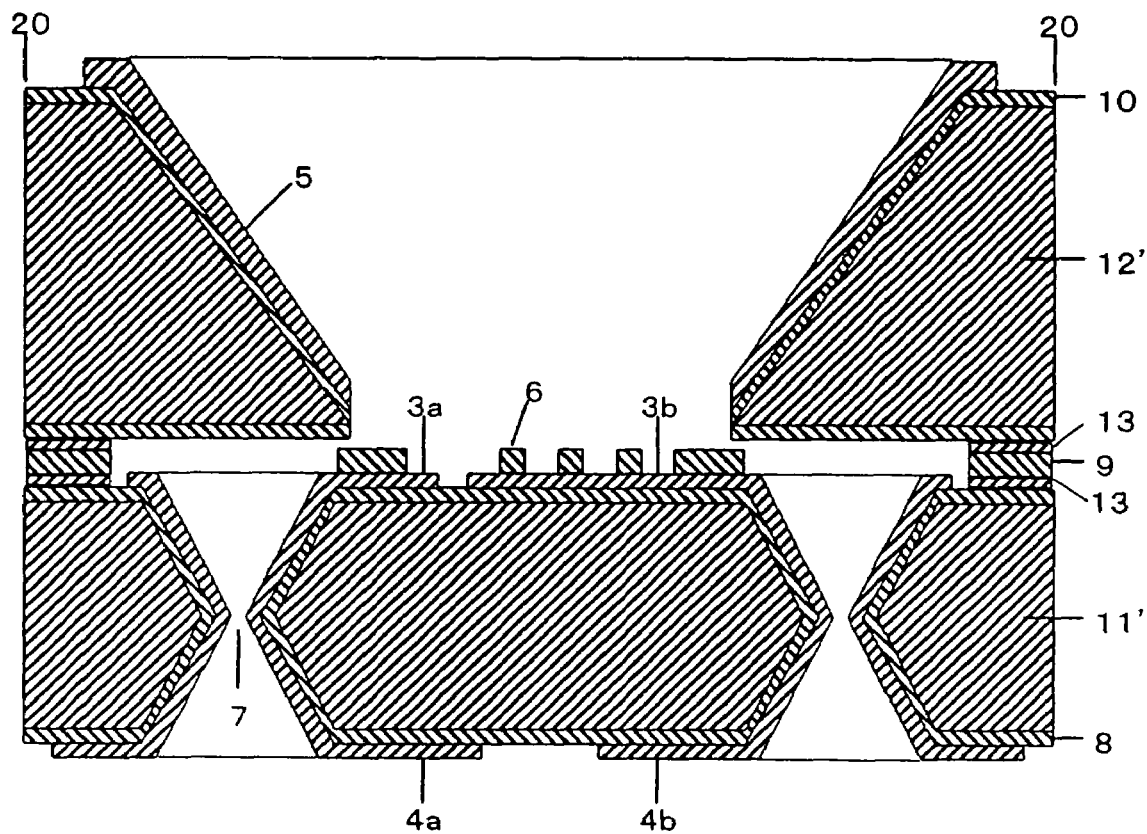
FIG. 5 is a sectional view showing the step of mounting the Si reflector on the Si submount according to one embodiment of the present invention.

First, as shown in FIG. 4A, a Si substrate 12 is prepared.

Figure 4B:
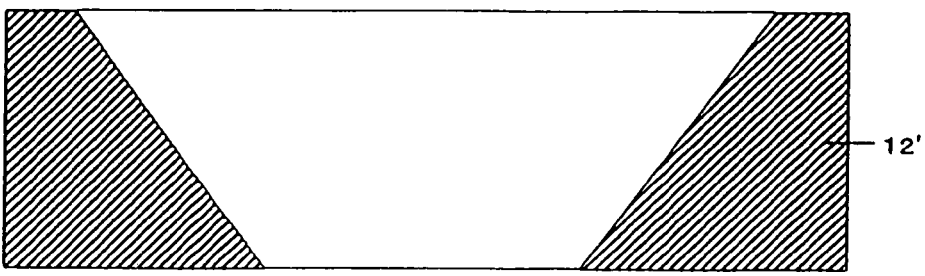

Then, the front side of the Si substrate 12 is subjected to photolithography, and the Si substrate 12 is immersed in an alkaline solution, e.g., a solution of potassium hydroxide, to form a through hole, as shown in FIG. 4B. A Si substrate 12' provided with the through hole is thereby formed. The Si substrate 12 is a Si substrate having a crystal plane (100), and slopes of the through hole are formed by wet-etching the Si substrate from the front side. The slopes thus formed are each given by a plane (111). Namely, an angle of the slope relative to a horizontal flat plane is 54.74° in terms of crystallography.

Figure 4C:
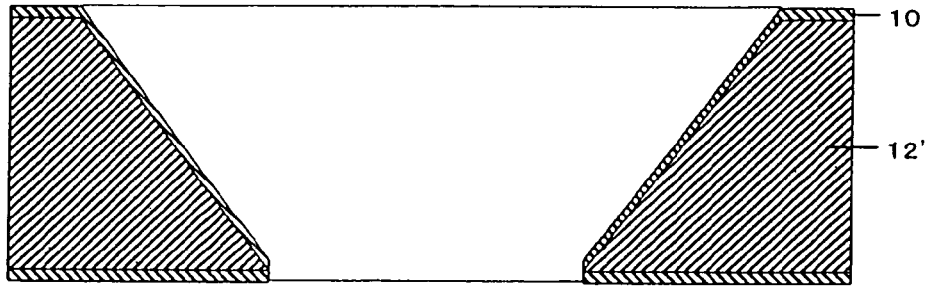

Then, as shown in FIG. 4C, oxides 10 are formed on the Si substrate 12' provided with the through holes.

Figure 4D:
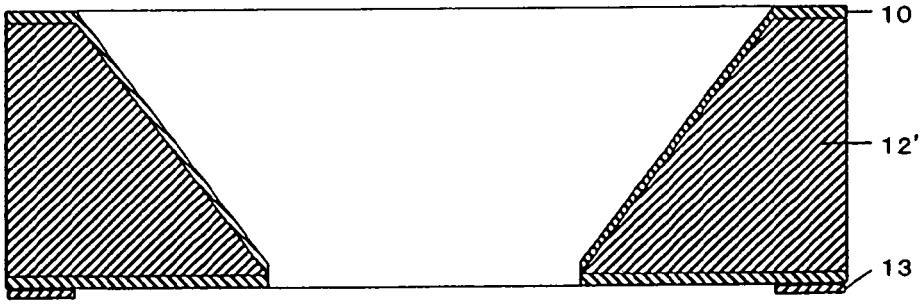

Then, as shown in FIG. 4D, the metalized region 13 is formed on a lower surface of the Si substrate 12' provided with the through hole. The metalized region 13 is used for joining with the thin-film solder 9.

Figure 4E:
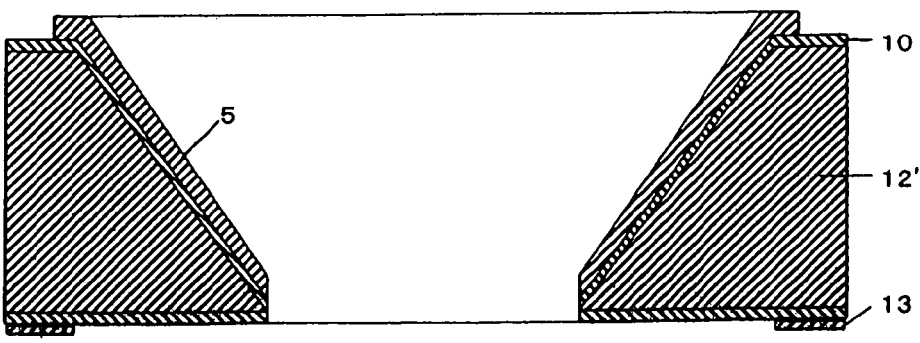

Then, as shown in FIG. 4E, the Al thin film 5 for reflecting light emitted from the LED is formed on the slopes of the Si substrate 12' provided with the through hole by, e.g., vapor deposition. The Al thin film 5 may be formed only on the slopes by using a mask or the like, or it may be formed over the entire surface including the upper surface of the Si substrate.

Steps of mounting the Si reflector on the Si submount will be described below with reference to FIG. 5.

In a step of joining the Si reflector to the Si submount, the Si substrate 11' provided with the through holes and the Si substrate 12' provided with the through hole are joined to each other with the thin-film solder 9 interposed between them. The joining between both the substrates is performed by successively placing the Si substrate 11' provided with the through holes and the Si substrate 12' provided with the through hole on a heater in this order, which is set to be heated to a temperature higher than the melting point of the thin-film solder 9 by about 20-50° C., and pressurizing both the substrates from above the Si substrate 12' provided with the through hole.

In a final step, a laminate comprising the Si substrate 11' provided with the through holes and the Si substrate 12' provided with the through hole, which have been joined together in the above step, is diced into predetermined outer dimensions (indicated by lines 20). Thus, the submount for the LED is completed, as shown in FIG. 1, which has the structure where the Si reflector 1 is mounted on the Si base substrate 2.

With the manufacturing steps described above, the submount for the LED constructed of the Si base substrate and the Si reflector 1 can be easily manufactured through simpler and more economical steps. As a result, the submount for the LED having economical superiority and high quality can be provided.

The structure of an LED illuminator using the submount for the LED according to one embodiment of the present invention will be described below with reference to FIG. 6.

Figure 6:
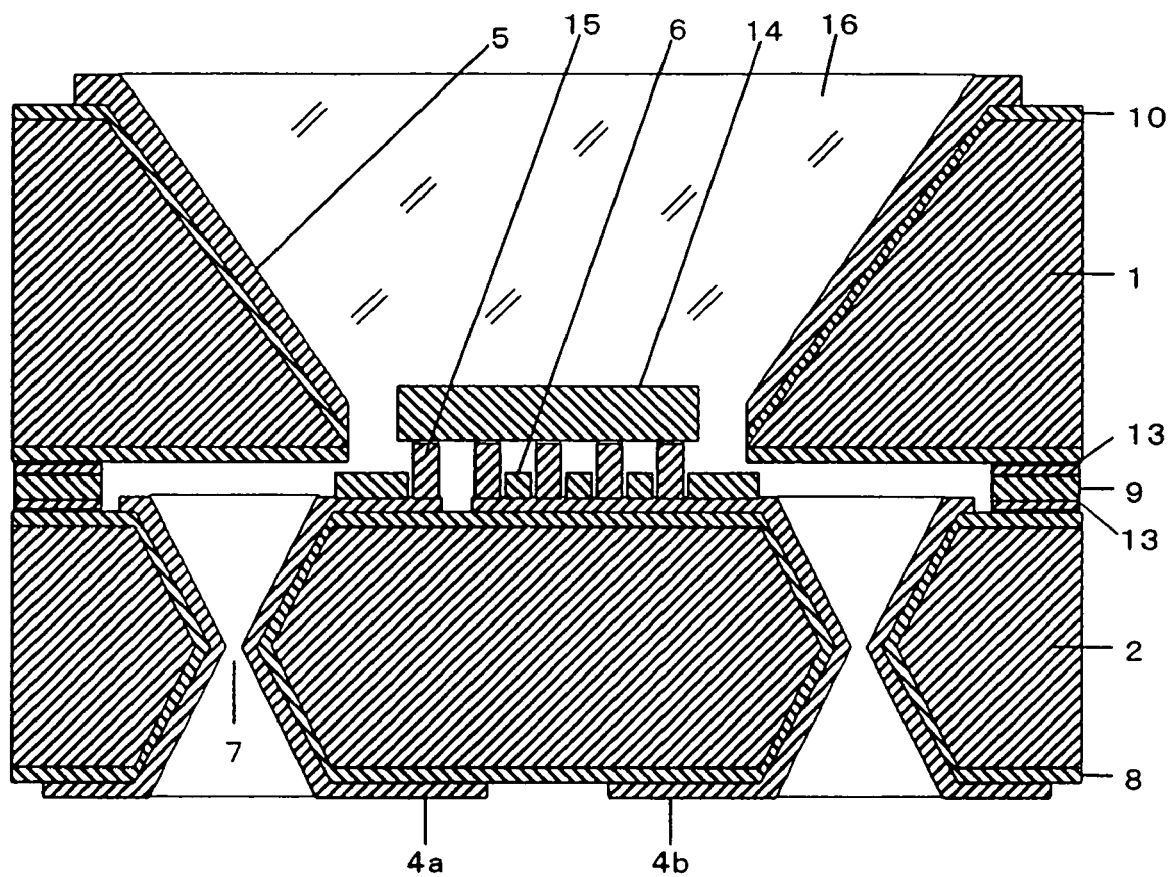
FIG. 6 is a sectional view showing the structure of an LED illuminator using the submount for the LED according to one embodiment of the present invention.

FIG. 6 is a sectional view showing the structure of the LED illuminator using the submount for the LED according to one embodiment of the present invention. Note that the same symbols as those in FIG. 1 denote the same components.

FIG. 6 shows a state where an LED 14 and a phosphor 16 are assembled in the submount for the LED, which has been manufactured through the steps described above with reference to FIG. 5. The LED 14 is connected and fixed to the input/output terminals 3a, 3b by using Au bumps 15. The phosphor 16 is filled in a cavity of the reflector 1 having an inverted trapezoidal shape in cross-section.

Light emitted from the LED 14 is absorbed by the phosphor 16 filled above the LED 14, and the phosphor 16 emits fluorescence. The fluorescence is reflected by reflecting surfaces provided as the Al thin film 5 of the reflector 1 and the Al thin film 6 on the Si base substrate 2, followed by being emitted to the outside. The heat generated from the LED 14 is dissipated through the Si base substrate 2.

A process for manufacturing many submounts for LED's according to one embodiment of the present invention at the same time will be described below with reference to FIG. 7.

Figure 7:
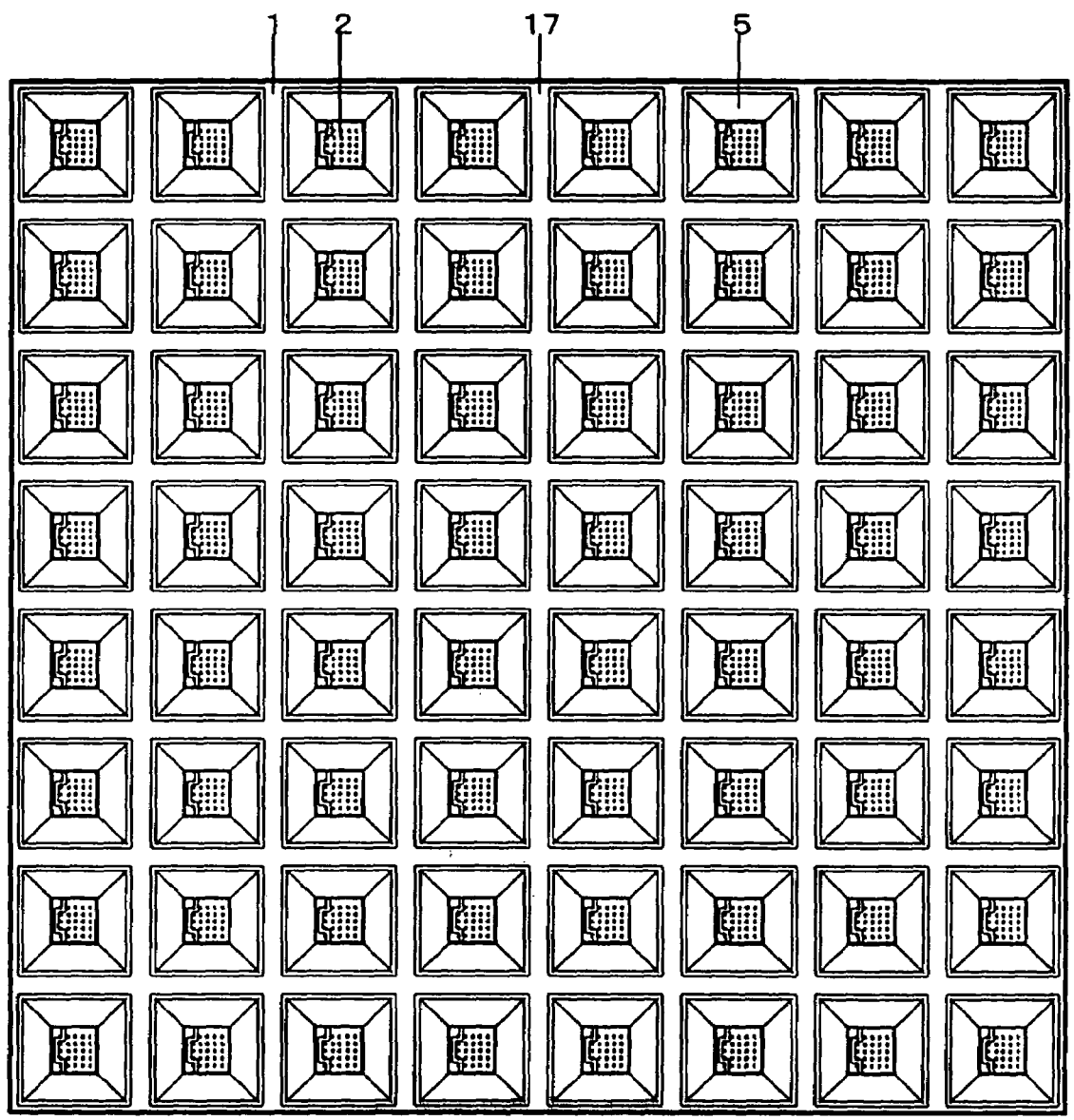
FIG. 7 is a plan view showing many submounts for LED's according to one embodiment of the present invention, which are arranged on a substrate when those submounts are manufactured at the same time.

FIG. 7 is a plan view showing many submounts for LED's according to one embodiment of the present invention, which are arranged on a substrate when those submounts are manufactured at the same time. Note that the same symbols as those in FIG. 1 denote the same components.

As shown in FIG. 7, Si base substrates in number ranging from several hundreds to several thousands are manufactured on a large-sized Si substrate, such as a Si wafer, and Si reflectors similarly manufactured on a large-sized Si substrate in the same number as the Si base substrates are mounted and fixed onto the Si base substrates in one-to-one relation. Then, both the large-sized Si substrates are diced into predetermined dimensions, whereby a large number of submounts for LED's can be manufactured at the same time. In addition, individual LED illuminators are completed by assembling LED's and filling phosphors in the manufactured submounts.

The submount for the LED according to this embodiment has the following superiority as a product. The superiority is described below in comparison with the known structure where a reflector is made of another material (a metal or a plastic or the like onto which a metal thin film is affixed) and a submount for an LED is mounted in a cavity formed in the reflector.

(1) Since the base substrate of the reflector is made of Si and the LED is directly mounted on the submount for the LED, the overall structure can be simplified, and the distance corresponding to the thickness of a separate submount, which has been required in the known structure, can be dispensed with, thus resulting in a shorter distance between the reflector and the LED. Accordingly, when a phosphor is filled in the reflector, the area occupied by the filled phosphor can be reduced. Because light is emitted from the whole of the phosphor, the area of a finally completed illuminator can be reduced in practice and a compact lens design can be realized.

In the known structure where the reflector is usually made of a metal or formed of an affixed metal thin film, it has been required to provide an electric terminal between the reflector and the submount in a state insulated from the reflector for the purpose of wire bonding. Such necessity has been a factor for further increasing the reflector size.

(2) The Si base substrate and the Si reflector are made of the same material, reliability in joining between them is very high with respect to heat cycles. It is therefore easily possible to manufacture not only a small submount for mounting one LED as shown in FIG. 2, but also submounts for mounting several hundreds to several thousands LED's on a large-sized substrate at the same time as shown in FIG. 7. Thus, this embodiment is superior in manufacturability when a large number of LED's are mounted on one substrate.

In the known structure where the submount and the reflector are made of different materials, there has been a possibility that cracks or peels may occur due to the difference in thermal expansion between the different materials upon application of a thermal load such as reflow.

(3) Since the base substrate and the reflector are both made of Si and Si has high thermal conductivity of 145 W/m·K, the heat generated from the LED can be easily dissipated with high efficiency, and characteristic deterioration of LED due to a temperature rise can be suppressed.

In the case of the reflector being made of a plastic or the like as in the known structure, when a large current flows as in an LED lamp with high brightness, the generated heat is not sufficiently radiated, whereby characteristic deterioration of LED due to a temperature rise is caused and thermal reliability of the lamp is reduced.

(4) Since the submount for the LED is manufactured in the state of a Si substrate, the semiconductor process such as photolithography can be directly employed in manufacturing, and therefore the submount for the LED can be manufactured in an economically superior way.

What is claimed is:

1. A submount for a light emitting diode, the submount comprising:

a Si base substrate having input/output terminals formed on a front side thereof; and a Si reflector having a sloped through hole and a reflecting film formed at least on a slope defining the through hole, wherein said Si reflector is mounted on said Si base substrate and fixedly joined to said Si base substrate; and wherein said reflecting film is an Al thin film.

2. The submount for the light emitting diode according to claim 1, wherein said Si base substrate has input/output pads formed on a backside thereof, and said input/output terminals and said input/output pads are electrically connected to each other with metalization made on the through hole formed in said Si base substrate.

3. The submount for the light emitting diode according to claim 1, wherein said Si reflector and said Si base substrate are joined to each other by a thin film solder.

* * * * *